(12) United States Patent
Morimoto et al.

(10) Patent No.: US 10,536,132 B2
(45) Date of Patent: Jan. 14, 2020

(54) ELASTIC WAVE ELEMENT, FILTER ELEMENT, AND COMMUNICATION DEVICE

(71) Applicant: KYOCERA Corporation, Kyoto-shi, Kyoto (JP)

(72) Inventors: Yusuke Morimoto, Osaka (JP); Masahisa Shimozono, Osaka (JP)

(73) Assignee: KYOCERA Corporation, Kyoto (JP)

( * ) Notice: Subject to any disclaimer, the term of this patent is extended or adjusted under 35 U.S.C. 154(b) by 287 days.

(21) Appl. No.: 15/527,215

(22) PCT Filed: Nov. 18, 2015

(86) PCT No.: PCT/JP2015/082417
§ 371 (c)(1),
(2) Date: May 16, 2017

(87) PCT Pub. No.: WO2016/080444
PCT Pub. Date: May 26, 2016

(65) Prior Publication Data
US 2017/0338796 A1    Nov. 23, 2017

(30) Foreign Application Priority Data

Nov. 18, 2014 (JP) ................................ 2014-233509

(51) Int. Cl.
*H03H 9/02* (2006.01)
*H03H 3/08* (2006.01)
*H03H 9/00* (2006.01)

(52) U.S. Cl.
CPC .......... *H03H 9/02858* (2013.01); *H03H 3/08* (2013.01); *H03H 9/0071* (2013.01); *H03H 9/0222* (2013.01); *H03H 9/02614* (2013.01)

(58) Field of Classification Search
CPC ..................... H03H 9/02535; H03H 9/02637
(Continued)

(56) References Cited

U.S. PATENT DOCUMENTS

2009/0243430 A1* 10/2009 Yokota ............... H03H 9/14541
                                                               310/313 B
2012/0133246 A1*  5/2012 Yaoi ..................... H03H 9/0222
                                                               310/313 C
(Continued)

FOREIGN PATENT DOCUMENTS

| JP | 2007-214902 A | 8/2007 |
| JP | 2007-267117 A | 10/2007 |
| JP | 2012-205215 A | 10/2012 |

OTHER PUBLICATIONS

International Search Report (Form PCT/ISA/210) dated Dec. 22, 2015, issued for PCT/JP2015/082417.
(Continued)

*Primary Examiner* — Derek J Rosenau
(74) *Attorney, Agent, or Firm* — Procopio Cory Hargreaves and Savitch LLP

(57) ABSTRACT

An elastic wave element having a piezoelectric substrate equipped with a first main surface, and an excitation electrode arranged on the first main surface and having multiple electrode fingers, wherein, in a cross-sectional view in the direction orthogonal to the first main surface, the width of the electrode fingers at a first height at a distance from the first main surface is greater than the width at a second height located closest to the first main surface.

15 Claims, 11 Drawing Sheets

(58) Field of Classification Search
USPC ...... 310/313 R, 313 A, 313 B, 313 C, 313 D
See application file for complete search history.

(56) References Cited

U.S. PATENT DOCUMENTS

| | | | |
|---|---|---|---|
| 2013/0069481 A1* | 3/2013 | Kimura | H01L 41/107 310/313 R |
| 2014/0232239 A1* | 8/2014 | Iwasaki | H03H 9/02984 310/313 C |

OTHER PUBLICATIONS

Written Opinion (Form PCT/ISA/237) dated Dec. 22, 2015, issued for PCT/JP2015/082417.

* cited by examiner

Model 1

Model 2

Model 3

Model 4

Model 5

Model 6

Model 7

US 10,536,132 B2

ELASTIC WAVE ELEMENT, FILTER ELEMENT, AND COMMUNICATION DEVICE

TECHNICAL FIELD

The present invention relates to an elastic wave element, a filter element, and a communication device.

BACKGROUND ART

In recent years, elastic wave elements have been used in a duplexer that filters signals transmitted from or received by an antenna in a communication device such as a mobile terminal. An elastic wave element is formed of a piezoelectric substrate and an excitation electrode on a main surface of the piezoelectric substrate. The elastic wave element utilizes a characteristic that an electric signal and a surface acoustic wave can be converted to each other in accordance with a relationship between the excitation electrode and the piezoelectric substrate.

A duplexer includes a plurality of elastic wave elements and thereby serves as, for example, a reception filter and a transmission filter (see, for example, Japanese Unexamined Patent Application Publication No. 2007-214902). With a plurality of elastic wave elements being combined, passbands of reception and transmission bands are set in the duplexer.

SUMMARY OF INVENTION

Technical Problem

In the foregoing duplexer, it is one of issues to enhance power durability.

Accordingly, the present invention has been made in view of the actual circumstances, and an object thereof is to provide an elastic wave element, a filter element, and a communication device that have high power durability.

Solution to Problem

An elastic wave element according to an embodiment of the present invention includes a piezoelectric substrate including a first main surface, and an excitation electrode including a plurality of electrode fingers, the excitation electrode being on the first main surface. Each of the plurality of electrode fingers is wider at a first height than at a second height in a cross-sectional view in a direction orthogonal to the first main surface, the second height being nearest to the first main surface.

A filter element according to an embodiment of the present invention includes the above-described elastic wave element, and at least one resonator on the piezoelectric substrate, the elastic wave element and the at least one resonator being connected to each other in a ladder pattern.

A communication device according to an embodiment of the present invention includes an antenna, the above-described filter element electrically connected to the antenna, and an RF-IC electrically connected to the filter element.

Advantageous Effects of Invention

According to the elastic wave element, filter element, and communication device according to the present invention, power durability can be enhanced.

DESCRIPTION OF EMBODIMENTS

Hereinafter, an elastic wave element, a filter element, and a communication device according to an embodiment of the present invention will be described with reference to the drawings. The figures used in the following description are schematic, and the dimensions, ratios, and so forth on the figures are not necessarily equal to actual dimensions, ratios, and so forth.

Any side of the elastic wave element may be regarded as an upper side or lower side, but hereinafter, for convenience, an orthogonal coordinate system xyz is defined, and the terms "upper surface", "lower surface", and so forth are used under the assumption that the positive side of the z direction is an upper side.

<Overview of Configuration of Elastic Wave Element>

Figure 1:
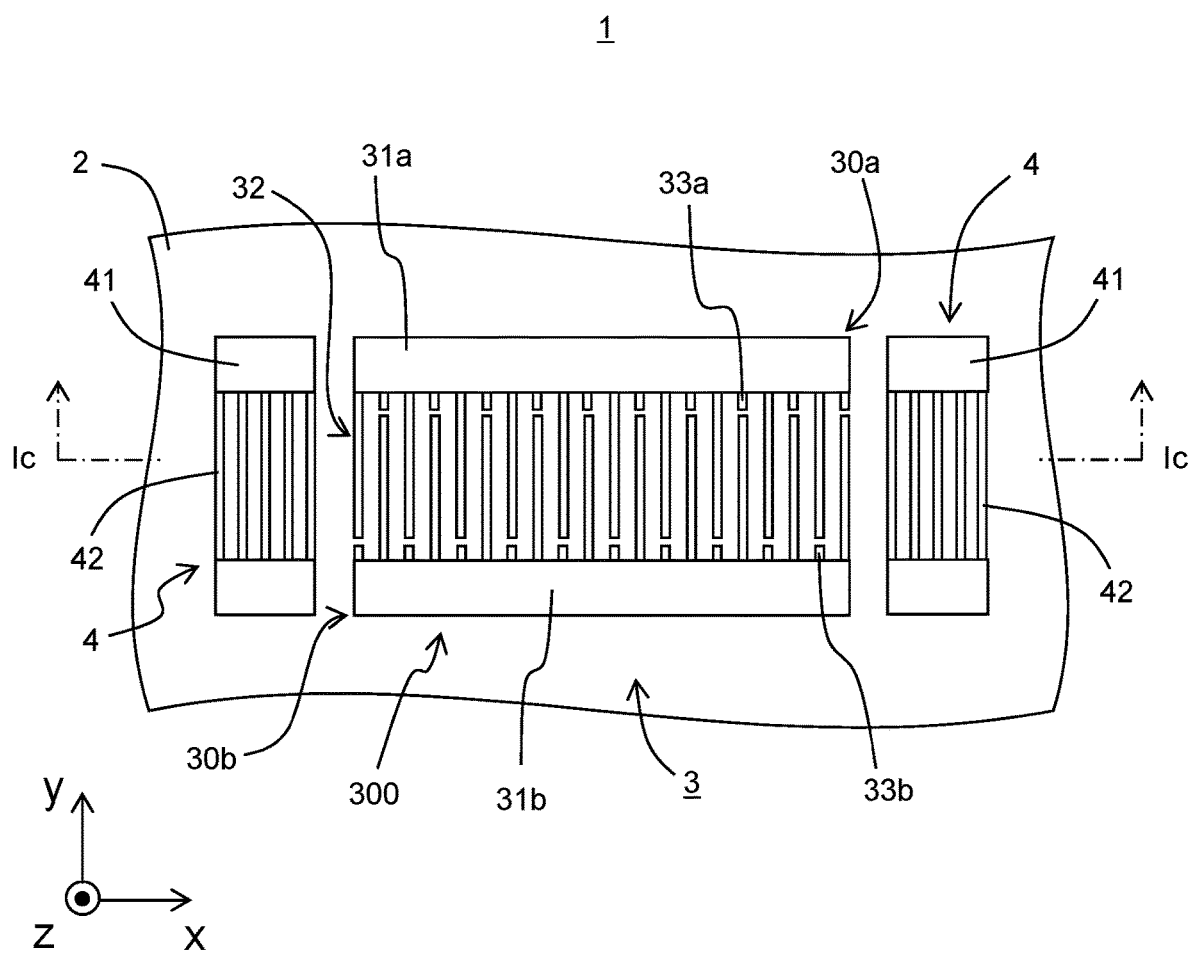
FIG. 1 is a plan view illustrating a configuration of an elastic wave element according to an embodiment of the present invention.
Figure 2A:
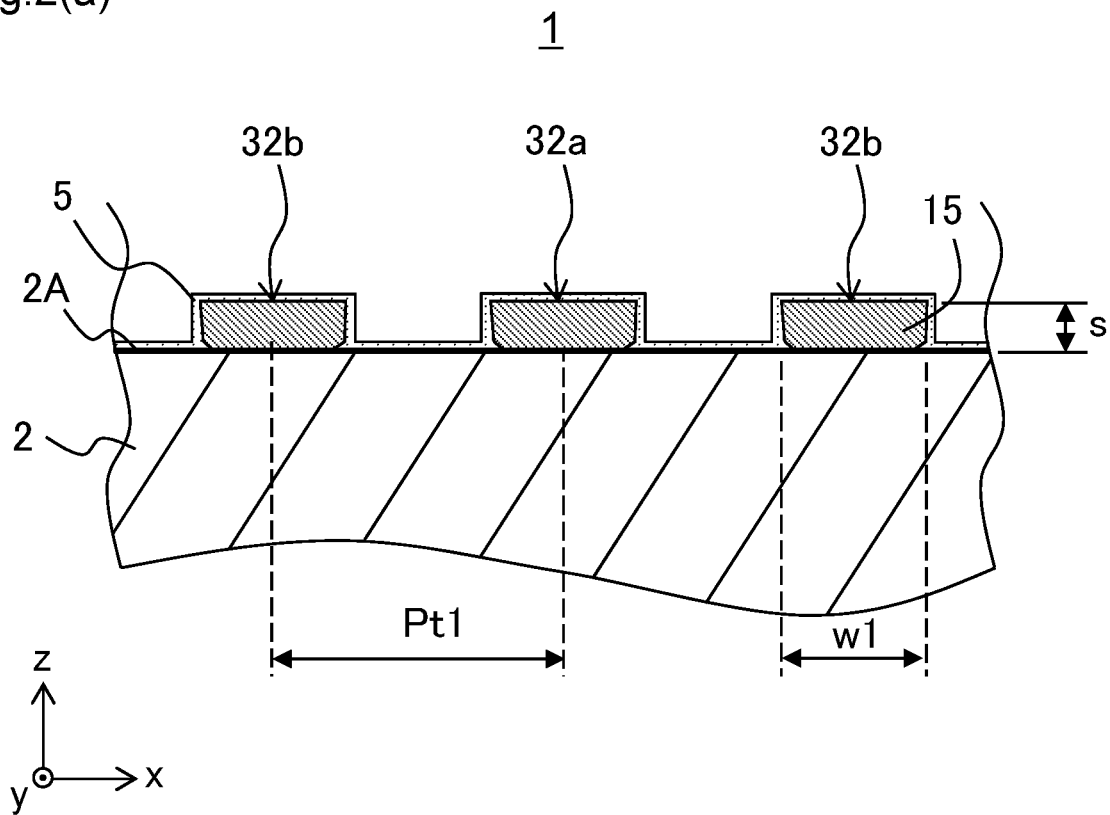
FIG. 2(a) and FIG. 2(b) are enlarged cross-sectional views of a main part taken along line Ic-Ic in FIG. 1.
Figure 2B:
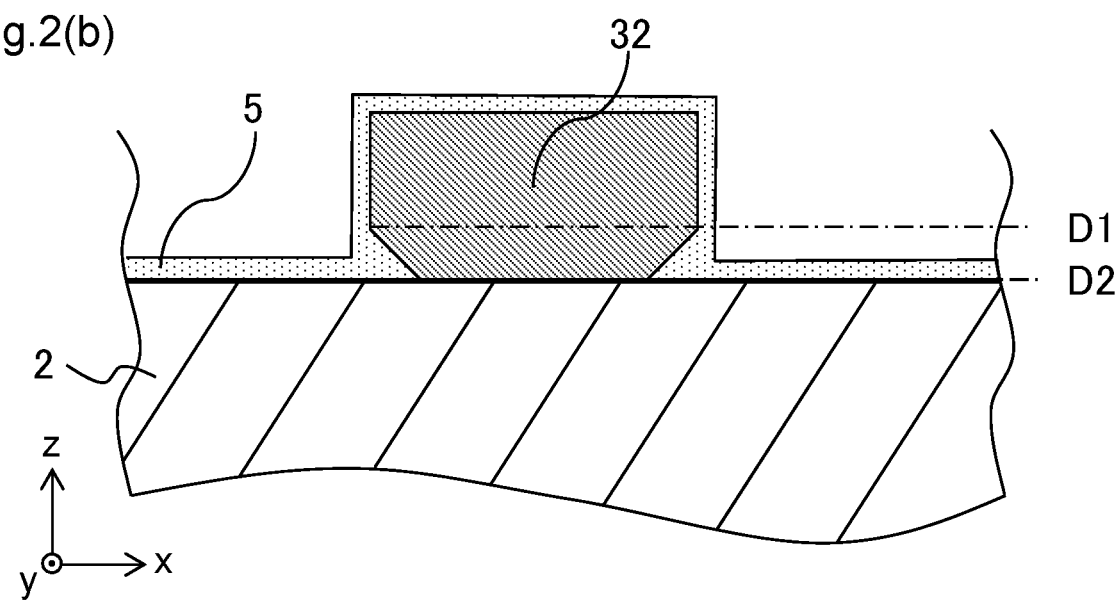

FIG. 1 is a plan view illustrating a configuration of an elastic wave element according to an embodiment of the present invention. In this example, a configuration of a SAW (Surface Acoustic Wave) element 1 using a SAW among elastic waves is illustrated. FIG. 2(a) is an enlarged cross-sectional view of a main part taken along line Ic-Ic in FIG. 1, and FIG. 2(b) is a further enlarged view of an IDT electrode 3 in FIG. 2(a). The SAW element 1 includes, as illustrated in FIG. 1, a piezoelectric substrate 2, an excitation (IDT: Interdigital Transducer) electrode 3 on an upper surface (first main surface) 2A of the piezoelectric substrate 2, and reflectors 4.

The piezoelectric substrate 2 is formed of a monocrystalline substrate composed of lithium niobate ($LiNbO_3$) crystals or lithium tantalate ($LiTaO_3$) crystals and having a piezoelectric property. Specifically, for example, the piezoelectric substrate 2 is formed of a 36° to 48° Y-X cut $LiTaO_3$ substrate. The shape in plan view and dimensions of the piezoelectric substrate 2 may be appropriately set. For example, the piezoelectric substrate 2 has a thickness (in the z direction) of 0.2 mm to 0.5 mm.

The IDT electrode 3 includes a first comb-teeth electrode 30a and a second comb-teeth electrode 30b, as illustrated in FIG. 1. In the following description, the first comb-teeth electrode 30a and the second comb-teeth electrode 30b are simply referred to as comb-teeth electrodes 30, which may not be distinguished from each other.

As illustrated in FIG. 1, the comb-teeth electrodes 30 include two busbars 31 facing each other and a plurality of electrode fingers 32 extending from each busbar 31 toward the other busbar 31. The pair of comb-teeth electrodes 30 is arranged such that first electrode fingers 32a and second electrode fingers 32b interdigitate (intersect) with one another in an elastic wave propagation direction.

The comb-teeth electrodes 30 also include dummy electrode fingers 33 facing the respective electrode fingers 32. First dummy electrode fingers 33a extend from a first busbar 31a toward the second electrode fingers 32b. Second dummy electrode fingers 33b extend from a second busbar 31b toward the first electrode fingers 32a. The dummy electrode fingers 33 are not necessarily disposed.

The busbars 31 are elongated and linearly extend with a substantially constant width, for example. Thus, edge portions facing each other of the busbars 31 are linear. The electrode fingers 32 are elongated, linearly extend with a substantially constant width, and are arranged at a substantially constant interval in the elastic wave propagation direction, for example.

The electrode fingers 32 of the pair of comb-teeth electrodes 30 constituting the IDT electrode 3 are set at a pitch Pt1. The pitch Pt1 is, for example, equivalent to half a wavelength $\lambda$ of an elastic wave at a resonance frequency. The wavelength $\lambda$ (2×Pt1) is, for example, 1.5 μm to 6 μm. The IDT electrode 3, in which most of the electrode fingers 32 are arranged at the pitch Pt1 and thereby the electrode fingers 32 are arranged at a constant period, is capable of efficiently generating an elastic wave.

Here, the pitch Pt1 corresponds to a gap between the center of a first electrode finger 32a and the center of a second electrode finger 32b adjacent to the first electrode finger 32a. A width w1 in the propagation direction of each electrode finger 32 is appropriately set in accordance with electrical characteristics or the like required for the SAW element 1. The width w1 of the electrode finger 32 is, for example, 0.3 to 0.7 times the pitch Pt1.

With such an arrangement of the electrode fingers 32, an elastic wave that propagates in a direction orthogonal to the electrode fingers 32 is generated. Thus, the two busbars 31 are arranged so as to face each other in a direction that crosses a direction in which an elastic wave is to propagate, in consideration of the crystal orientation of the piezoelectric substrate 2. The electrode fingers 32 are disposed so as to extend in a direction orthogonal to the direction in which an elastic wave is to propagate. The elastic wave propagation direction is specified in accordance with the orientations of the electrode fingers 32. In this embodiment, the orientations of the electrode fingers 32 may be described with reference to the elastic wave propagation direction for convenience.

The number of electrode fingers 32 on each side (first electrode fingers 32a and second electrode fingers 32b) is 50 to 350.

The lengths of the electrode fingers 32 (the lengths from the busbar to the ends) are set to be substantially the same, for example. The length over which the electrode fingers 32 facing each other interdigitate with each other (intersecting width) is 10 to 300 μm. The length or intersecting width of each electrode finger 32 may be changed, for example, the length or intersecting width may be increased or decreased in the propagation direction. Specifically, an apodized IDT electrode 3 may be formed by changing the length of each electrode finger 32 in the propagation direction. In this case, spurious responses of the transverse mode can be reduced or power durability can be enhanced.

The IDT electrode 3 is formed of, for example, a conductive layer 15 made of metal. An example of the metal is Al or an alloy mainly containing Al (Al alloy). The AL alloy may be an Al—Cu alloy, for example. The IDT electrode 3 may be formed of a plurality of metal layers. The dimensions of the IDT electrode 3 are appropriately set in accordance with the electrical characteristics or the like required for the SAW element 1. The IDT electrode 3 has a thickness S (in the z direction) of 50 nm to 600 nm, for example.

The IDT electrode 3 may be disposed directly on the upper surface 2A of the piezoelectric substrate 2 or may be disposed on the upper surface 2A of the piezoelectric substrate 2 via an underlying layer composed of another member. The other member is made of Ti, Cr, an alloy thereof, or the like, for example. When the IDT electrode 3 is disposed on the upper surface 2A of the piezoelectric substrate 2 via the underlying layer, the thickness of the other member is set so as to hardly affect the electrical characteristics of the IDT electrode 3 (for example, 5% of the thickness of the IDT electrode 3 when Ti is used).

Furthermore, a mass-addition film may be stacked on the electrode fingers 32 of the IDT electrode 3 in order to enhance the temperature characteristics of the SAW element 1. $SiO_2$ or the like may be used for the mass-addition film, for example.

When being applied with a voltage, the IDT electrode 3 excites an elastic wave that propagates in the x direction near the upper surface 2A of the piezoelectric substrate 2. The excited elastic wave is reflected at a boundary of a region where no electrode fingers 32 are disposed (an elongated region between electrode fingers 32 adjacent to each other). Accordingly, a standing wave having a half wavelength equal to the pitch Pt1 of the electrode fingers 32 is formed. The standing wave is converted into an electric signal having the same frequency as the standing wave and is taken out by the electrode fingers 32. In this way, the SAW element 1 functions as a one-port resonator. The reflectors 4 are disposed so as to sandwich the IDS electrode 3 in the elastic wave propagation direction. The reflectors 4 are substantially slit-shaped. That is, the reflectors 4 each include reflector busbars 41 facing each other in a direction crossing the elastic wave propagation direction, and a plurality of reflection electrode fingers 42 extending in a direction orthogonal to the elastic wave propagation direction between the busbars 41. The reflector busbars 41 are elongated, linearly extend with a substantially constant width, and are disposed in parallel to the elastic wave propagation direction, for example.

The reflection electrode fingers 42 are arranged at a pitch Pt2 at which an elastic wave excited by the IDT electrode 3 is reflected. If the pitch Pt1 of the IDT electrode 3 is set to half the wavelength $\lambda$ of an elastic wave, the pitch Pt2 may be set to be nearly equal to the pitch Pt1. The wavelength $\lambda$ (2×Pt2) is 1.5 μm to 6 μm, for example. Here, the pitch Pt2 corresponds to a gap between the center of a reflection electrode finger 42 and the center of a reflection electrode finger 42 adjacent thereto in the propagation direction.

The reflection electrode fingers 42 are elongated and linearly extend with a substantially constant width. A width w2 of each reflection electrode finger 42 may be set to be substantially equal to the width w1 of the electrode finger 32, for example. The reflectors 4 are made of the same material as the IDT electrode 3 and have a thickness equivalent to that of the IDT electrode 3, for example.

The reflectors 4 are disposed with a gap G between each reflector 4 and the IDT electrode 3. Here, the gap G is a gap between the center of the electrode finger 32 nearest to the reflector 4 of the IDT electrode 3 and the center of the reflection electrode finger 42 nearest to the IDT electrode 32 of the reflector 4. The gap G is normally set to be equal to the pitch Pt1 (or Pt2) of the electrode fingers 32 of the IDT electrode 3.

As illustrated in FIG. 2, a protective layer 5 is on the piezoelectric substrate 2 so as to cover the IDT electrode 3 and the reflectors 4. Specifically, the protective layer 5 covers surfaces of the IDT electrode 3 and the reflectors 4 and also covers a portion of the upper surface 2A of the piezoelectric substrate 2 exposed from the IDT electrode 3 and the reflectors 4. The protective layer 5 has a thickness of 1 nm to 800 nm, for example.

The protective layer 5 is made of an insulating material and contributes to protection from corrosion or the like. Preferably, the protective layer 5 is made of a material such as $SiO_2$ in which the elastic wave propagation speed increases as temperature increases, and accordingly a change in electrical characteristics of the elastic wave element 1 resulting from a change in temperature can be reduced.

Alternatively, the protective layer 5 may be made of a material such as SiNx in order to increase moisture resistance.

In the SAW element 1 according to this embodiment, each electrode finger 32 of the IDT electrode 3 is wider at a first position (first height) D1 than at a second position (second height) D2 in a cross-sectional view. Here, the first position D1 and the second position D2 represent the heights from the upper surface 2A in a direction (z direction) orthogonal to the upper surface 2A. The first position D1 is away from the upper surface 2A of the piezoelectric substrate 2. The second position D2 corresponds to the position of a lower surface of the electrode finger 32 and is a position nearest to the upper surface 2A. In other words, the electrode finger 32 includes a region that becomes narrower toward the upper surface 2A of the piezoelectric substrate 2, in a cross-section on a plane parallel to the upper surface 2A. In still other words, the electrode finger 32 includes a region recessed inward at a position near a junction between the electrode finger 32 and the piezoelectric substrate 2.

With such a cross-sectional shape of the electrode finger 32, the area where the electrode finger 32 is in contact with the piezoelectric substrate 2 can be reduced, and as a result an influence of vibration caused by an elastic wave can be reduced. That is, as a result of reducing vibration received by the electrode finger 32, the power durability of the SAW element 1 can be enhanced.

Here, the electrode finger 32 is not a multilayer body but is formed of a single layer made of a single material. In this case, stress concentration at an interface caused by stacking a plurality of layers, and peeling or break caused thereby are unlikely to occur. Thus, the SAW element 1 that is highly reliable can be provided. Note that a single material does not mean a single element, and includes, for example, Al added with Cu.

Figure 3:
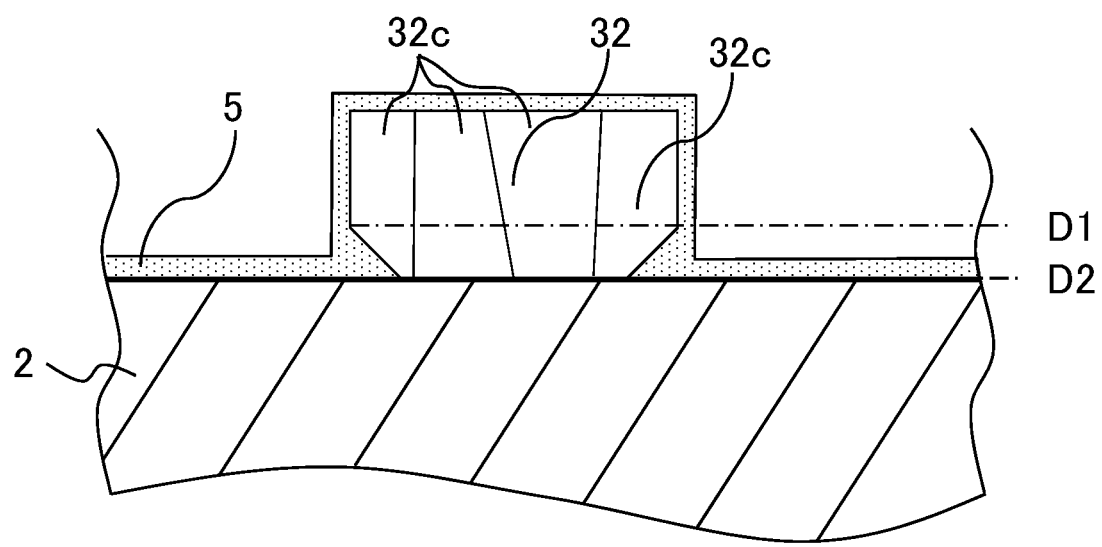
FIG. 3 is a schematic enlarged cross-sectional view of a part of an IDT electrode.
Figure 3:
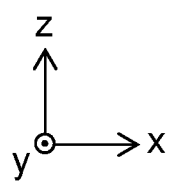

In particular, if the electrode finger 32 is formed of crystal grains 32c, each being continuous in the thickness direction, as illustrated in FIG. 3, the reliability can further be enhanced.

If the electrode finger 32 continuously becomes narrower from the first position D1 toward the second position D2, the absence of a discontinuous portion suppresses stress concentration and enhances reliability.

Furthermore, if the electrode finger 32 has a constant width, which is the width at the second position D2, the electrode finger 32 has merely a small width and propagation loss is likely to increase. However, according to this embodiment, the electrode finger 32 is wider at a position above the second position D2 than at the second position D2. Accordingly, an electromechanical coupling coefficient can be reduced and steepness can be increased, compared to a rectangular electrode finger with the same cross-sectional area (the same volume). Furthermore, with such a configuration, the propagation loss of the SAW element 1 can be reduced.

The first position D1 may be at or below the center in thickness of the electrode finger 32, in consideration of ensuring the volume of the electrode finger 32 and keeping the covering with the protective layer 5 favorable.

Modification Example 1 of SAW Element

In the example illustrated in FIGS. 1 to 3, each electrode finger 32 has a constant width from the upper surface of the electrode finger 32 to the first position D1 in the cross-sectional view, but the width is not necessarily constant. In particular, as illustrated in FIG. 4, the electrode finger 32 may have a third position (third height) D3 at which the electrode finger 32 is narrower than at the first position D1 and which is opposite the second position D2 across the first position D1.

With this configuration, the center of gravity of the electrode finger 32 can be shifted in the vertical direction (z direction).

As a result, the electromechanical coupling coefficient of the electrode finger 32 can be adjusted. Furthermore, the propagation loss can be reduced. In particular, with the first position D1 being located near the upper surface 2A of the piezoelectric substrate 2 relative to the center in thickness of the electrode finger 32, as illustrated in FIG. 4, the center of gravity of the electrode finger 32 can be moved downward. Accordingly, the electromechanical coupling coefficient can further be reduced and the propagation loss can be reduced.

The above-described configuration may be realized by disposing a wide portion 32d illustrated in FIG. 4.

In the electrode finger 32, an end portion of a surface farthest from the upper surface 2A (the surface opposite to the surface on the upper surface 2A side) is regarded as a first end portion 321, and an end portion at the second position D2 is regarded as a second end portion 322. The portion outside a virtual line L1 connecting the first end portion 321 and the second end portion 322 in the cross-sectional view is regarded as the wide portion 32d. The wide portion 32d is at a height position at which the center thereof corresponds to the first position D1 away from the upper surface 2A of the piezoelectric substrate 2. The wide portion 32d is a part of the entire electrode finger 32, and the percentage thereof may be half the entire electrode finger 32 or less. That is, the thickness in the z direction of the wide portion 32d is half the thickness of the entire electrode finger 32 or less.

More specifically, the thickness of the wide portion 32d may be, for example, 18% or less of the thickness of the IDT electrode 3. The characteristics of an elastic wave excited by the electrode fingers 32 of the IDT electrode 3 vary according to the widths and thicknesses of the electrode fingers 32 in the elastic weave propagation direction. With the foregoing value being 18% or less, an influence of the wide portion 32d on the characteristics of an excited elastic weave can be suppressed.

In the example illustrated in FIG. 4, an upper end of the wide portion 32d is nearer to the upper surface 2A of the piezoelectric substrate 2 than the upper surface of the IDT electrode 3 (the electrode finger 32). That is, the electrode finger 32 has the third position D3 which is away from the upper surface 2A of the piezoelectric substrate 2, at which the electrode finger 32 is narrower than at the first position D1, and which is opposite the second position D2 across the first position D1.

Figure 4A:
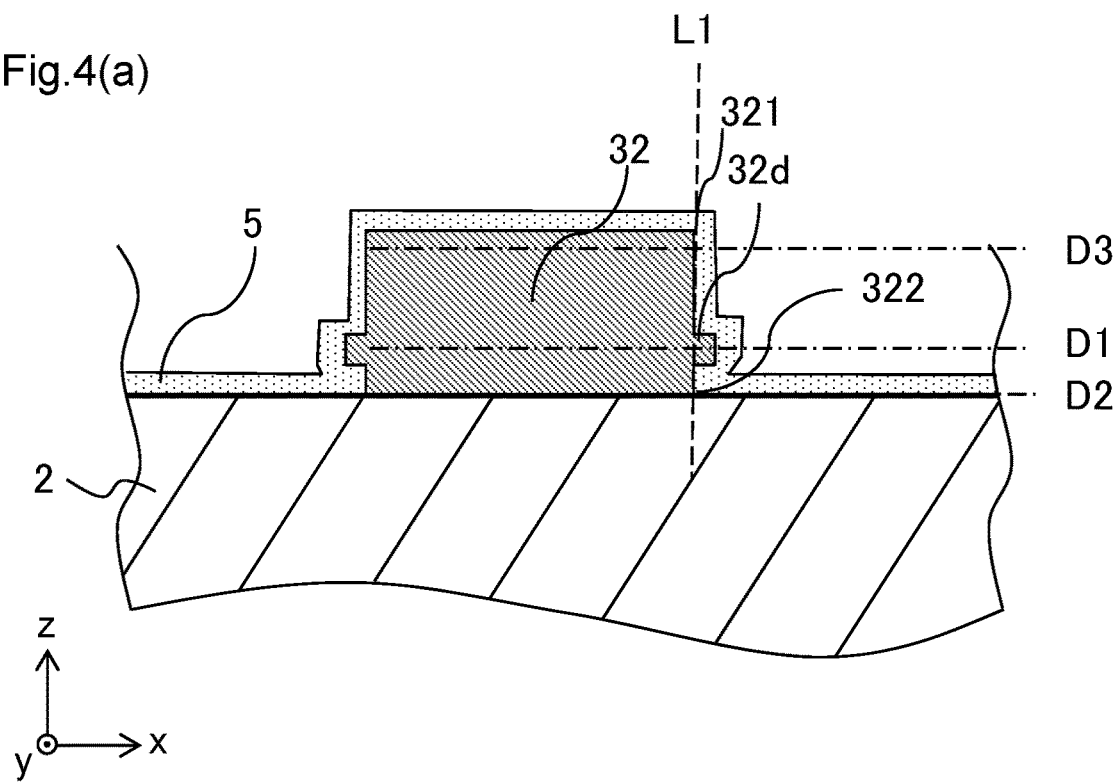
FIG. 4(a) and FIG. 4(b) are enlarged cross-sectional views of a main part illustrating modification examples of an electrode finger of the IDT electrode.

With the wide portion 32d, the function of adjusting the electromechanical coupling coefficient of the electrode 32 can be enhanced and the propagation loss can be reduced. In particular, with the wide portion 32d being located near the upper surface 2A of the piezoelectric substrate 2 relative to the center in thickness of the electrode finger 32, as illustrated in FIG. 4(a), the center of gravity of the electrode finger 32 can be moved downward. Accordingly, the electromechanical coupling coefficient can further be reduced and the propagation loss can be reduced.

Since the propagation loss can be reduced by moving the center of gravity of the electrode finger 32 toward the upper surface 2A, compared to the electrode finger having a rectangular cross section, it is preferable that a height position at which the width of protrusion of the wide portion 32d from the virtual line L1 is the largest be below the center in thickness of the electrode finger 32. The "width of protrusion" is a width in a plane direction parallel to the upper surface 2A, that is, a width in the x direction and the y direction.

Figure 4B:
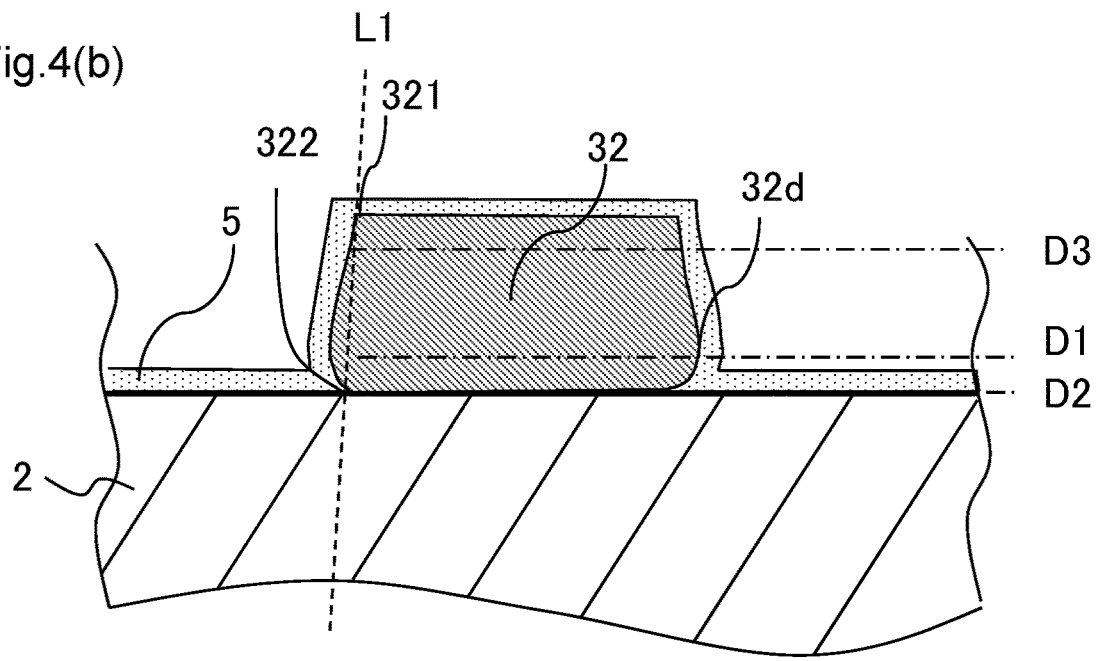

The wide portion 32d may be rectangular as illustrated in FIG. 4(a) or may have a curved side surface as illustrated in FIG. 4(b). In the latter case, there is no portion where stress concentrates and reliability can be enhanced. Also, the protective layer 5 can be formed on the electrode finger 32 with a good covering condition. The width in which the wide portion 32d protrudes from the virtual line L1 is preferably about 1 to 6% relative to the width w1 of the electrode finger 32 on the surface on the upper surface 2a side or the opposite surface. With such a value of the width of protrusion, the protective layer 5 that covers a side surface of a recessed portion located below the wide portion 32d (near the upper surface 2A) can be formed.

Modification Example 2 of SAW Element

Figure 5:
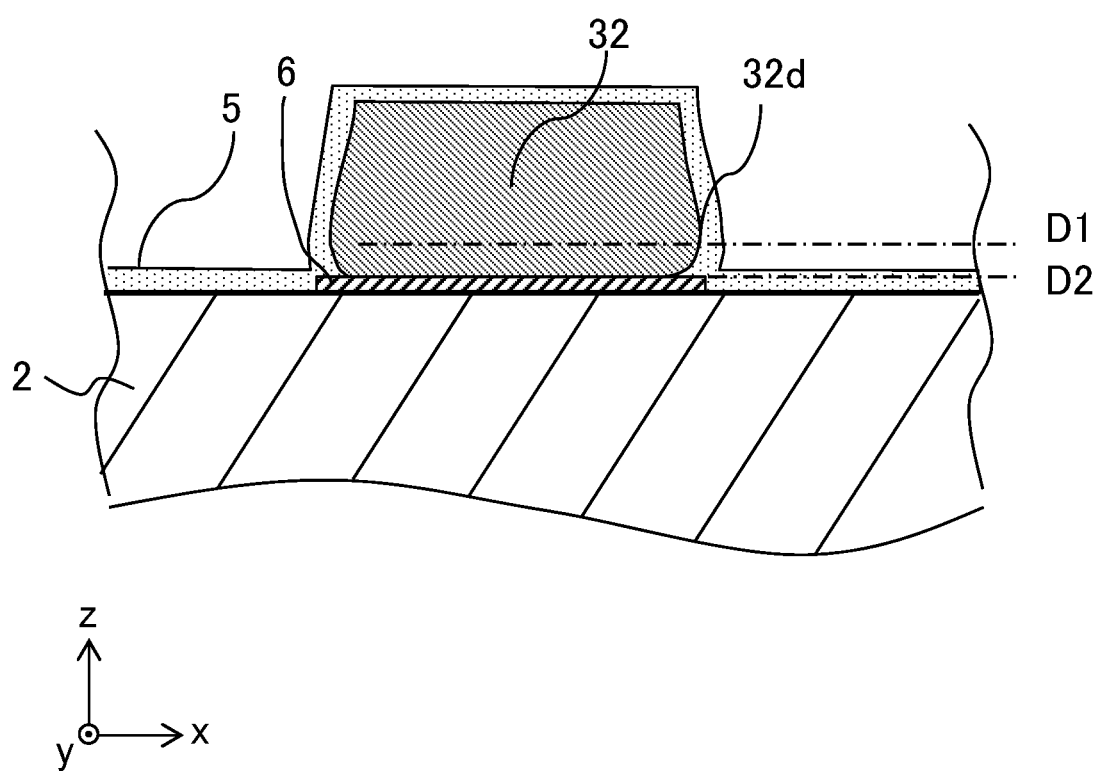
FIG. 5 is an enlarged cross-sectional view of a main part illustrating a modification example of an electrode finger of the IDT electrode.

In the examples illustrated in FIGS. 1 to 4, each electrode finger 32 of the IDT electrode 3 is disposed directly on the upper surface 2A of the piezoelectric substrate 2. Alternatively, an underlying layer 6 may be disposed between the upper surface 2A of the piezoelectric substrate 2 and the electrode finger 32, as illustrated in FIG. 5. The underlying layer 6 is made of, for example, Ti, Cr, an alloy thereof, or the like. When the IDT electrode 3 is disposed on the upper surface 2A of the piezoelectric substrate 2 via the underlying layer 6, the thickness of the underlying layer 6 formed of a member different from that of the IDT electrode 3 is set so as to hardly affect the electrical characteristics of the IDT electrode 3 (for example, 5% of the thickness of the IDT electrode 3 when Ti is used).

With use of the underlying layer 6, adhesion between the IDT electrode 3 and the piezoelectric substrate 2 can be enhanced. In particular, the underlying layer 6 may have an area larger than that of a lower surface of the electrode finger 32, and the lower surface of the electrode finger 32 may be disposed within the upper surface of the underlying layer 6. In other words, a portion in contact with the piezoelectric substrate 2 of the underlying layer 6 may be wider than a portion in contact with the electrode finger 32 of the underlying layer 6 in the cross-sectional view. With this configuration, adhesion can be enhanced over the entire lower surface of the electrode finger 32.

Furthermore, the underlying layer 6 may be made of Ti. Since Ti is a high-melting-point metal, a heating step in a process for manufacturing and mounting the SAW element 1 or heat generated during operation of the SAW element 1 does not cause a change in characteristics, and thus the SAW element 1 that is highly reliable can be provided. Ti has a higher mechanical strength to withstand vibration or repeated stress of elastic waves than Al or an Al alloy. Thus, a larger contact area of the underlying layer 6 enables reduction of an influence of vibration on the IDT electrode 3 and enhancement of the power durability of the SAW element 1. Furthermore, as a result of disposing the underlying layer 6 made of Ti on the upper surface 2A of the piezoelectric substrate 2, Al or an Al alloy disposed thereon can be preferentially oriented in a <111> direction. Accordingly, a defect in a crystal grain or at a crystal grain boundary as a diffusion path can be reduced in the IDT electrode 3, and the reliability and power durability can be enhanced.

When the underlying layer 6 is used, the height positions of the first position D1, the second position D2, and the third position D3 are defined with reference to the upper surface of the underlying layer 6.

Modification Example 3 of SAW Element

Figure 11:
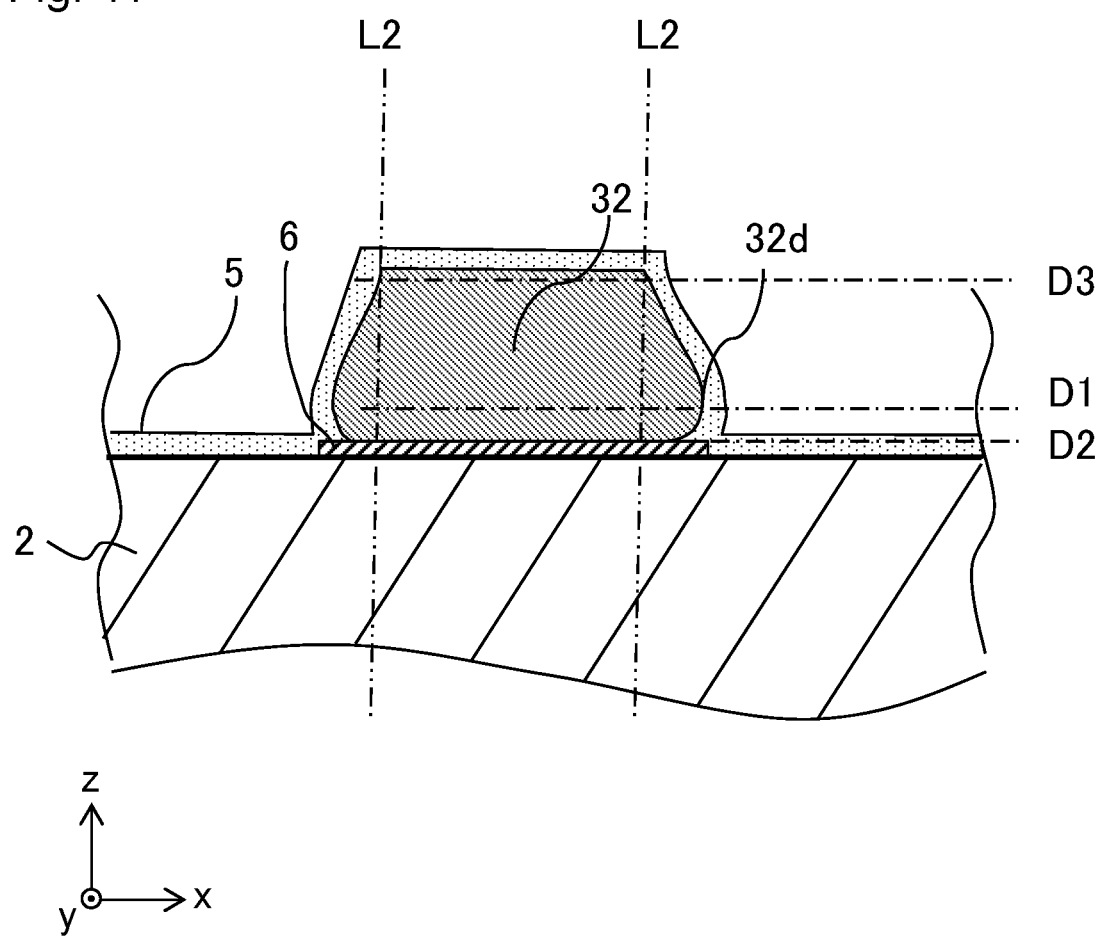
FIG. 11 is an enlarged cross-sectional view of a main part illustrating a modification example of an electrode finger of the IDT electrode.

In the examples illustrated in FIGS. 1 to 5, the widths of the upper surface and lower surface of each electrode finger 32 are almost the same. In this case, the width of the electrode finger 32 at the third position D3 is larger than or almost the same as the width at the second position D2. In contrast, as illustrated in FIG. 11, the width of the electrode finger 32 at the third position D3 may be smaller than the width at the second position D2. In FIG. 11, perpendiculars L2 that are perpendicularly drawn through end portions of the upper surface of the electrode finger and the upper surface 2A are depicted with two-dot chain lines.

In the example illustrated in FIG. 11, the upper surface of the electrode finger 32 is narrower than the lower surface (the surface at the second position D2). With this configuration, the center of gravity of the electrode finger 32 can be shifted downward and thus the SAW element 1 with small loss can be provided. In this example, a side surface is curved. Alternatively, a portion from the upper surface to the first position D1 may be tapered.

With this shape, a configuration for enhancing power durability with a decreased area of contact with the piezoelectric substrate 2, a configuration for reducing loss with a larger cross-sectional area at the first position D1 than the area of contact with the piezoelectric substrate 2, and a configuration for reducing loss and adjusting an electromechanical coupling coefficient with the center of gravity located on the upper surface side can be simultaneously obtained.

In the SAW element 1 according to the above-described embodiment and modification examples, the electrode fingers 32 with a desired cross-sectional shape can be obtained by forming a film into a desired shape by using a photomask or the like or by processing a film into a desired shape through dry etching or the like after forming the film. Specifically, for example, the conductive layer 15 made of a metal is formed on the upper surface 2A of the piezoelectric substrate 2, a desired pattern is formed thereon by using a photoresist, and then an unnecessary portion of the conductive layer 15 is removed through dry etching. The cross-sectional shape of the electrode fingers 32 can be controlled by adjusting a dry etching selectivity, that is, the ratio of the etching speed of the photoresist to the etching speed of the conductive layer 15.

The electrode fingers 32 may have the above-described cross-sectional shape at the cross section in a plane orthogonal to the longitudinal direction. With this configuration, power durability can be enhanced particularly in the elastic wave propagation direction. Also, the reflection electrode fingers 42 of the reflectors 4 may have a similar cross-sectional shape as well as the electrode fingers 32 of the IDT electrode 3. The cross-sectional shape of the electrode fingers 32 may be tapered near the wide portion 32d.

Furthermore, the first position D1 may be 100 Å or more away from the upper surface 2A. In general, when a high-crystallinity film is formed, the film in the range of 100 Å from a surface where film formation starts (underlying surface) is dense and strongly coupled with the underlying surface. Thus, a recessed region directly receiving vibration is formed in the range from the underlying surface to the height position of 100 Å, and thereby power durability can further be enhanced.

If the width of the electrode finger 32 at the second position D2 is smaller than the width at the upper surface of the electrode finger 32, a rectangular electrode with a width constant from the upper surface of the electrode finger 32 is assumed, and the first position D1 and so forth may be adjusted so that the area of a portion protruding from the assumed shape (wide portion) is almost the same as the area of a portion on the inner side of the assumed shape (recessed region).

Also, when a rectangular electrode with a width constant from the upper surface of the electrode finger 32 is assumed, a portion protruding from the assumed shape (wide portion) may be located below the center in thickness of the electrode finger 32 so as to shift the center of gravity of the electrode finger 32 downward, and accordingly loss can be reduced.

In the above-described examples, the substrate of the elastic wave element is formed of only a piezoelectric substrate. Alternatively, the substrate may be formed of a thin piezoelectric substrate and a support substrate bonded to the piezoelectric substrate. In this case, for example, a Si substrate or sapphire substrate having a coefficient of linear expansion smaller than that of the piezoelectric substrate may be used as the support substrate.

<Filter Element and Communication Device>

Figure 6:
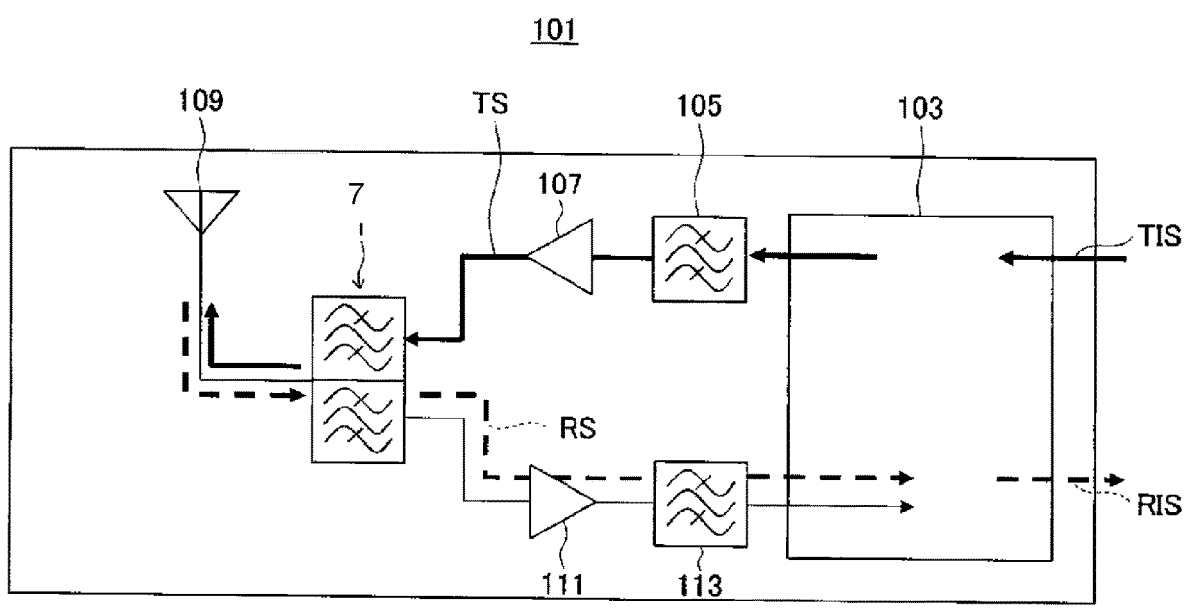
FIG. 6 is a schematic diagram for describing a communication device according to an embodiment of the present invention.

FIG. 6 is a block diagram illustrating a main part of a communication device 101 according to an embodiment of the present invention. The communication device 101 performs radio communication by using radio waves. A duplexer 7 has a function of separating a signal of a transmission frequency and a signal of a reception frequency from each other in the communication device 101.

In the communication device 101, a transmission information signal TIS including information to be transmitted undergoes modulation and frequency rise (conversion of a carrier frequency to a radio frequency signal) performed by an RF-IC 103 and results in a transmission signal TS. The transmission signal TS undergoes a process of removing therefrom an unnecessary component other than a transmission passband performed by a bandpass filter 105, is amplified by an amplifier 107, and is input to the duplexer 7. The duplexer 7 removes an unnecessary component other than a transmission passband from the transmission signal TS input thereto and outputs it to an antenna 109. The antenna 109 converts the electric signal (transmission signal TS) input thereto to a radio signal and transmits the radio signal.

In the communication device 101, a radio signal received by the antenna 109 is converted to an electric signal (reception signal RS) by the antenna 109 and is input to the duplexer 7. The duplexer 7 removes an unnecessary component other than a reception passband from the reception signal RS input thereto and outputs the reception signal RS to an amplifier 111. The output reception signal RS is amplified by the amplifier 111, and an unnecessary component other than a reception passband is removed therefrom by a bandpass filter 113. The reception signal RS then undergoes frequency lowering and demodulation performed by the RF-IC 103 and results in a reception information signal RIS.

The transmission information signal TIS and the reception information signal RIS each may be a low-frequency signal (baseband signal) including appropriate information and may be, for example, an analog audio signal or digitalized audio signal. The passband of a radio signal may be based on various standards such as UMTS (Universal Mobile Telecommunications System). A scheme of modulation may be any of phase modulation, amplitude modulation, frequency modulation, and a combination of any two or more of them.

Figure 7:
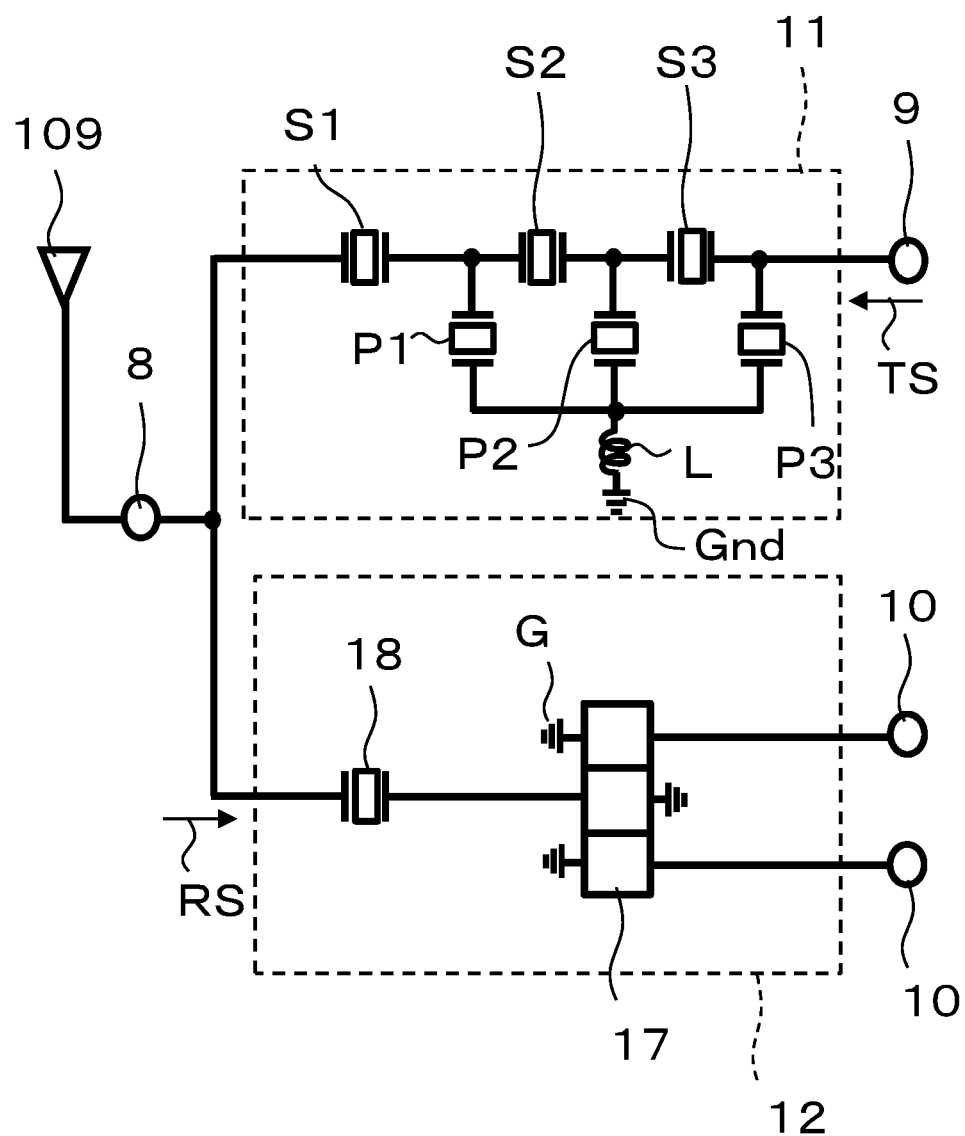
FIG. 7 is a circuit diagram for describing a duplexer according to an embodiment of the present invention.

FIG. 7 is a circuit diagram illustrating a configuration of the duplexer 7 according to an embodiment of the present invention. The duplexer 7 is a duplexer that is used in the communication device 101 in FIG. 6. The duplexer 7 includes a filter element constituting a transmission filter 11 and/or a reception filter 12. The filter element constituting the transmission filter 11 and/or the reception filter 12 is formed of the SAW element 1 and a resonator on the piezoelectric substrate 2.

The SAW element 1 is, for example, a SAW element constituting a part of a ladder filter circuit of the transmission filter 11 in the duplexer 7 illustrated in FIG. 6. The transmission filter 11 includes the piezoelectric substrate 2, and series resonators S1 to S3 and parallel resonators P1 to P3 on the piezoelectric substrate 2, as illustrated in FIG. 7.

The duplexer 7 is mainly formed of an antenna terminal 8, a transmission terminal 9, reception terminals 10, the transmission filter 11 between the antenna terminal 8 and the transmission terminal 9, and the reception filter 12 between the antenna terminal 8 and the reception terminals 10.

The transmission terminal 9 receives the transmission signal TS from the amplifier 107. The transmission signal TS received by the transmission terminal 9 is output to the antenna terminal 8 after an unnecessary component other than a transmission passband is removed therefrom in the transmission filter 11. The antenna terminal 8 receives the reception signal RS from the antenna 109. The reception signal RS is output to the reception terminals 10 after an unnecessary component other than a reception passband is removed therefrom in the reception filter 12.

The transmission filter 11 is formed of, for example, a ladder SAW filter in which a plurality of resonators is connected in a ladder pattern. Specifically, the transmission filter 11 includes the three series resonators S1, S2, and S3 connected in series between an input side and an output side of the transmission filter 11, and the three parallel resonators P1, P2, and P3 between a series arm serving as wiring for connecting the series resonators to one another and a reference potential portion Gnd. That is, the transmission filter 11 is a ladder filter with a three-stage structure. Note that the number of stages of the ladder filter in the transmission filter 11 is not specified.

An inductor L is disposed between the parallel resonators P1, P2, and P3 and the reference potential portion Gnd. The inductance of the inductor L is set to a predetermined value so as to form an attenuation pole outside the passband of the transmission signal, thereby increasing out-of-band attenuation. Each of the series resonators S1, S2, and S3 and the parallel resonators P1, P2, and P3 is formed of a SAW resonator such as the SAW element 1.

The reception filter 12 includes, for example, a multimode SAW filter 17 and an auxiliary resonator 18 connected in series to the input side of the multimode SAW filter 17. In this embodiment, multimode includes dual-mode. The multimode SAW filter 17 has a balanced-unbalanced transform function and the reception filter 12 is connected to the two reception terminals 10 to which balanced signals are output. The reception filter 12 is not limited to the one formed of the multimode SAW filter 17, and may be formed of a ladder filter or a filter that does not have a balanced-unbalanced transform function.

An impedance matching circuit formed of an inductor or the like may be disposed between a connection point of the transmission filter 11, the reception filter 12, and the antenna terminal 8, and a ground potential portion G.

The SAW element according to this embodiment may be used as any of the series resonators S1 to S3 or any of the parallel resonators P1 to P3. With use of the SAW element 1 according to this embodiment, the SAW element 1 with high power durability can be obtained. In particular, with use of the SAW element 1 as at least one of the parallel resonators P1 to P3, the power durability of the filter can be enhanced. Each of the resonators constituting the ladder transmission filter 11 may be the SAW element according to this embodiment.

EXAMPLES

To verify an effect of changing the cross-sectional shape of the electrode fingers 32 as in the SAW element 1 according to the embodiment and modification examples, models of a SAW element were set and simulation was performed for evaluation. The basic configuration of a model SAW element is as follows.

Figure 8:
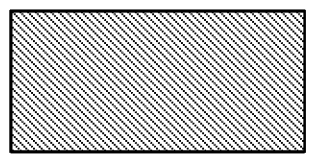
FIG. 8 is a schematic diagram illustrating electrode shapes of elastic wave elements according to an example and a comparative example.
Figure 8:
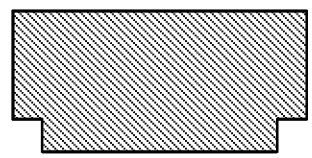
Figure 8:
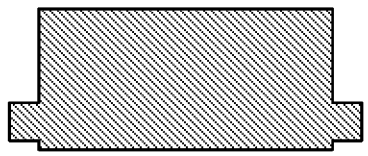
Figure 8:
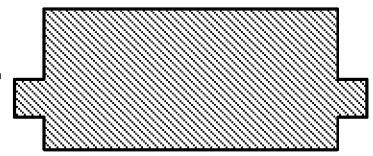
Figure 8:
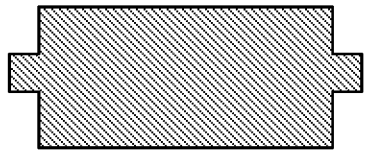
Figure 8:
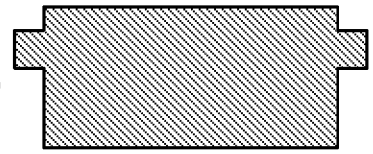
Figure 8:
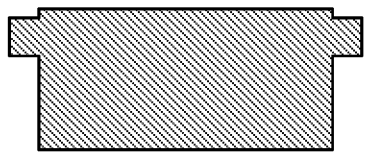
Figure 8:
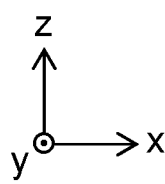

[Piezoelectric Substrate 2]
Material: 42° Y-cut X-propagation LiTaO$_3$ substrate
[IDT Electrode 3]
Material: Al—Cu alloy
(Note that the underlying layer 6 made of 6-nm Ti is between the piezoelectric substrate 2 and the conductive layer 15)
Thickness (Al—Cu alloy layer): 154 nm
Electrode fingers 32 of IDT electrode 3:
(Number of fingers) 200
(Pitch Pt1) 1.06 μm
(Duty: w1/Pt1) 0.5
(Intersecting width W) 20λ (λ=2×Pt1)
[Reflector 4]
Material: Al—Cu alloy
(Note that the underlying layer made of 6-nm Ti is between the piezoelectric substrate 2 and the conductive layer 15)
Thickness (Al—Cu alloy layer): 154 nm
Number of reflection electrode fingers 42: 30
Pitch Pt2 of reflection electrode fingers 42: 1.06 μm
Intersecting width of reflection electrode fingers 42: 20λ (λ=2×Pt1)
Gap G from IDT electrode 3: Pt1
[Protective Layer 5]
Material: SiO$_2$
Thickness: 15 nm In the SAW element having the foregoing basic configuration, the shapes of models 1 to 7 illustrated in FIG. 8 were applied to the cross-sectional shape of each electrode finger 32. Specifically, model 1 is a conventional configuration in which the cross-sectional shape is rectangular, model 2 is a configuration having a region of a small width on the upper surface 2A side of the piezoelectric substrate 2, and models 3 to 7 are configurations including the wide portion 32d. The height position at which the wide portion 32d is disposed varies among models 3 to 7, that is, the wide portion 32d is the nearest to the upper surface 2A of the piezoelectric substrate 2 in model 3, and the height position is changed so that the distance from the upper surface 2A gradually increases from model 4 to model 7. In model 2, calculation was performed to form a recess of 5.4% with respect to the width w1 of the electrode finger 32. In models 3 to 7, calculation was performed to form a protrusion of 6.1%.

In models 2 to 7 in the example, the width on the piezoelectric substrate 2 side that is necessary to form electrode fingers of the same cross-sectional area is small, and thus power durability can be enhanced compared to the configuration of model 1, which is a comparative example.

Figure 9:
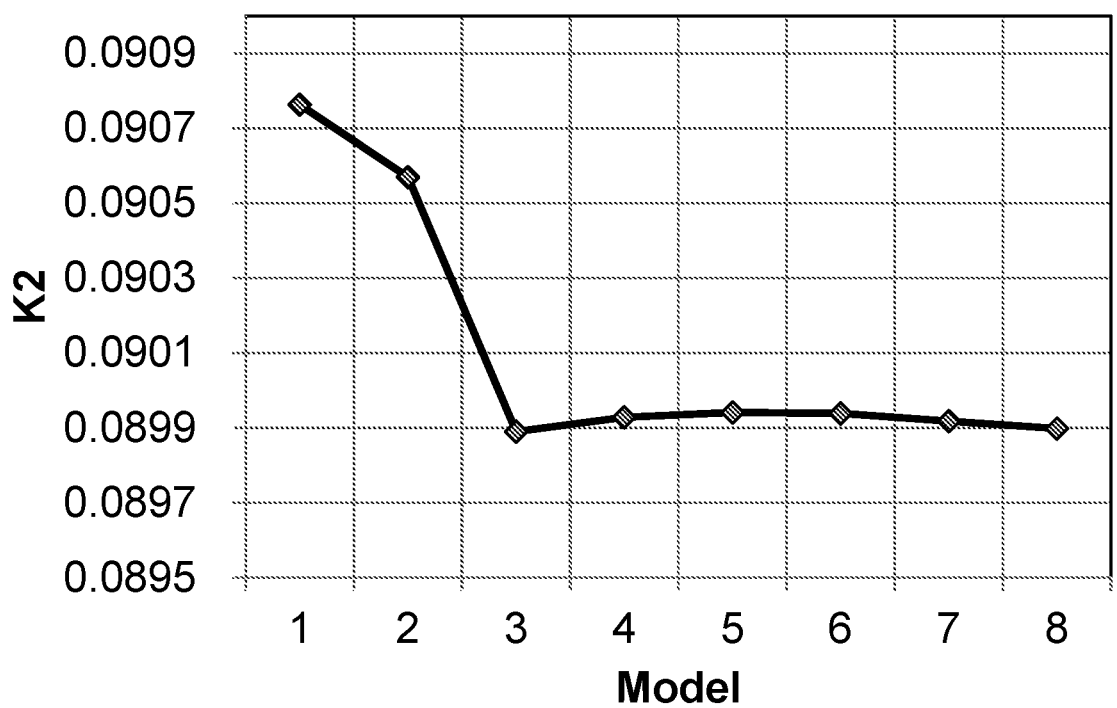
FIG. 9 is a graph illustrating a result of simulation of electromechanical coupling coefficients of the elastic wave elements according to the example of the comparative example.

A result of simulation of electromechanical coupling coefficients in the individual models is illustrated in FIG. 9. In FIG. 9, the horizontal axis represents models and the vertical axis represents electromechanical coupling coefficient (unit: –).

As is clear from FIG. 9, the electromechanical coupling coefficient is smaller in models 2 to 7 having the configurations according to the example than in model 1 having a conventional configuration. This verifies that models 2 to 7 increase steepness and decrease the gap between a resonance point and an antiresonance point compared to model 1.

Figure 10:
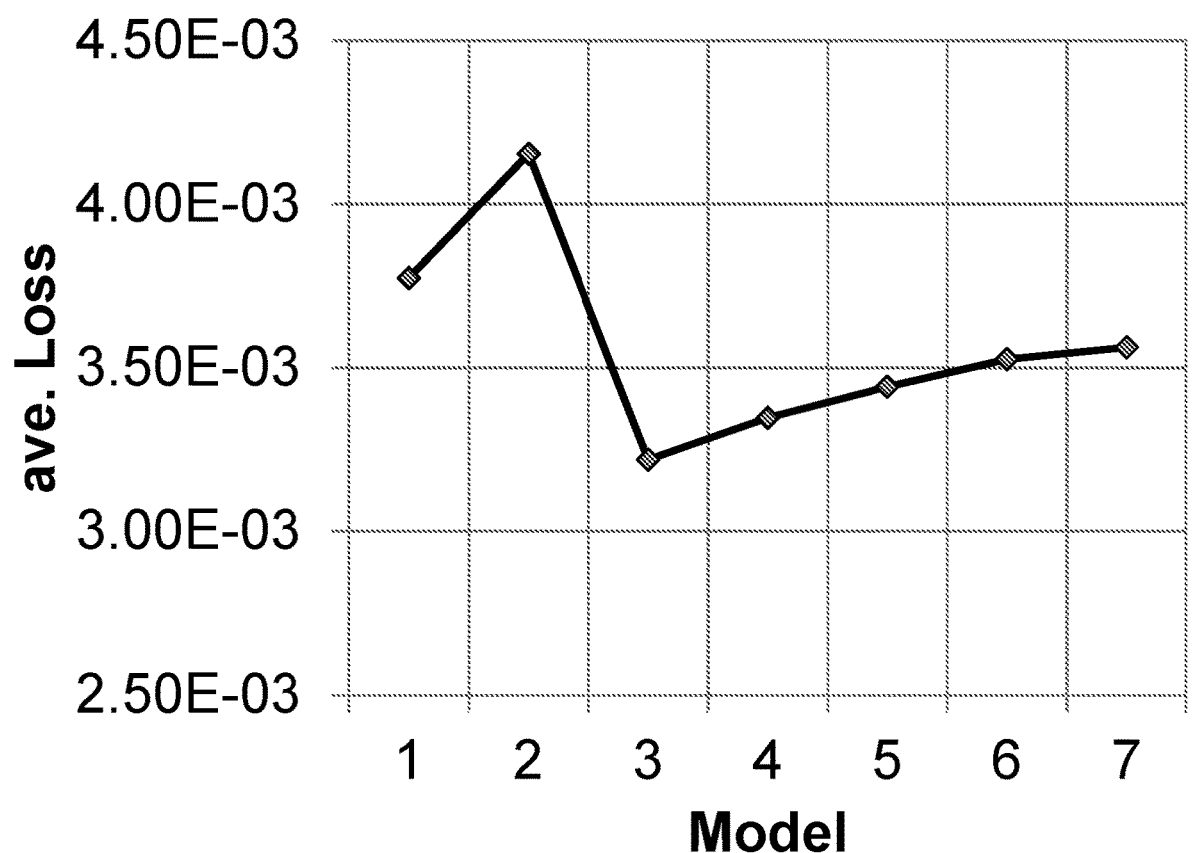
FIG. 10 is a graph illustrating a result of simulation of average propagation losses of the elastic wave elements according to the example of the comparative example.

Furthermore, a result of averaging propagation losses at the resonance point and the antiresonance point (average propagation loss) is illustrated in FIG. 10. In FIG. 10, the horizontal axis represents models and the vertical axis represents average propagation loss (unit: db/λ).

As illustrated in FIG. 10, if the wide portion 32d is disposed, the propagation loss can be reduced compared to the comparative example (model 1). In particular, if the wide portion 32d is near the upper surface 2A of the piezoelectric substrate 2 (model 3), the average propagation loss can be particularly reduced. In a ladder filter, the propagation losses at both the resonance point and antiresonance point affect filter characteristics. Thus, the SAW element 1 including the wide portion 32d, in which average propagation loss is small, is suitable for forming a ladder filter.

In the configuration of model 2 that does not include the wide portion 32d, the average propagation loss is larger than model 1, but the propagation loss at the resonance point is smallest among models 1 to 7. Accordingly, it was found that model 2 is an effective configuration for reducing the propagation loss at the resonance point. When each electrode finger is rectangular as in model 1, power durability tends to decrease if Δf (the gap between the resonance point and the antiresonance point) is small and if propagation loss is to be reduced. In contrast, with the cross-sectional shape of each electrode finger 32 of models 2 to 7, Δf can be reduced, propagation loss can be reduced, and power durability can be enhanced.

Simulation was also performed for a configuration of model 8 in which the wide portion 32d is in contact with the upper surface 2A of the piezoelectric substrate 2 via the underlying layer 6. In model 8, there is no region with a small width near the upper surface 2 of the piezoelectric substrate 2. In this case, improvement in propagation loss was not seen both in the resonance point and antiresonance point, compared to model 1. Accordingly, it could be verified that a region with a small width is necessary near the upper surface 2A of the piezoelectric substrate 2 in order to reduce propagation loss.

REFERENCE SIGNS LIST 1 elastic wave element (SAW element)
2 piezoelectric substrate
2A upper surface
3 excitation (IDT) electrode
30 comb-teeth electrode (first comb-teeth electrode 30a, second comb-teeth electrode 30b)
31 busbar (first busbar 31a, second busbar 31b)
32 electrode finger (first electrode finger 32a, second electrode finger 32b)
33 dummy electrode finger (first dummy electrode finger 33a, second dummy electrode finger 33b)
4 reflector
41 reflector busbar
42 reflection electrode finger
5 protective layer
7 duplexer
8 antenna terminal
9 transmission terminal
10 reception terminal
11 transmission filter
12 reception filter
15 conductive layer
17 multimode SAW filter
18 auxiliary resonator
101 communication device
103 RF-IC
105 bandpass filter
107 amplifier
109 antenna
111 amplifier
113 bandpass filter
S1 to S3 series resonator
P1 to P3 parallel resonator

The invention claimed is:

1. An elastic wave element comprising:
a piezoelectric substrate comprising a first main surface, wherein the first main surface comprises a flat portion; and
an excitation electrode comprising a plurality of electrode fingers, the excitation electrode being on the first main surface, such that the plurality of electrode fingers are located on the flat portion of the first main surface,
wherein each of the plurality of electrode fingers is wider at a first height than at a second height in a cross-sectional view in a direction orthogonal to the first main surface, the second height being nearest to the first main surface.

2. The elastic wave element according to claim 1, wherein the each of the plurality of electrode fingers becomes narrower from the first height toward the second height in the cross-sectional view in the direction orthogonal to the first main surface.

3. The elastic wave element according to claim 1, wherein the each of the plurality of electrode fingers comprises a single material.

4. The elastic wave element according to claim 1, wherein the each of the plurality of electrode fingers is narrower at a third height than at the first height in the cross-sectional view in the direction orthogonal to the first main surface, the first height being between the third height and the second height.

5. The elastic wave element according to claim 4, wherein the each of the plurality of electrode fingers is narrower at the third height than at the second height.

6. The elastic wave element according to claim 1, wherein the each of the plurality of electrode fingers comprises:
a first end portion, the first end portion being an end of a surface of the each of the plurality of electrode fingers, in the cross-sectional view in the direction orthogonal to the first main surface, farthest from the first main surface,
a second end portion, the second end portion being an end of the each of the plurality of electrode fingers at the second height in the cross-sectional view in the direction orthogonal to the first main surface, and
a wide portion is located outside a virtual line connecting the first end portion and the second end portion in the cross-sectional view in the direction orthogonal to the first main surface, the wide portion being thinner than half a thickness of the each of the plurality of electrode fingers.

7. The elastic wave element according to claim 1, wherein the each of the plurality of electrode fingers comprises a side surface curved from the first height to the second height.

8. The elastic wave element according to claim 1, further comprising: an underlying layer having a conductive property, the underlying layer being between the first main surface and the each of the plurality of electrode fingers, and the underlying layer being wider than a lower surface of the each of the plurality of electrode fingers in the cross-sectional view in the direction orthogonal to the first main surface.

9. A filter element comprising:
the elastic wave element according to claim 1; and
at least one resonator on the piezoelectric substrate, the elastic wave element and the at least one resonator being connected to each other in a ladder pattern.

10. A communication device comprising:
an antenna;
the filter element according to claim 9 electrically connected to the antenna; and
an RF-IC electrically connected to the filter element.

11. The elastic wave element according to claim 1, wherein the first height is farther from the first main surface than the second height.

12. The elastic wave element according to claim 1, wherein the each of the plurality of electrode fingers becomes continuously narrower from the first height toward the second height in the cross-sectional view in the direction orthogonal to the first main surface.

13. The elastic wave element according to claim 1, wherein the each of the plurality of electrode fingers comprises crystal grains.

14. The elastic wave element according to claim 6, wherein the wide portion is 18 percent or less of the thickness of the each of the plurality of electrode fingers.

15. The elastic wave element according to claim 8, wherein the underlying layer comprises a first surface in contact with the piezoelectric substrate and a second surface in contact with the each of the plurality of electrode fingers, the first surface being larger than the second surface.

* * * * *